(12) United States Patent
Lee et al.

(10) Patent No.: US 11,621,381 B2
(45) Date of Patent: Apr. 4, 2023

(54) MOUNTING STRUCTURE FOR MOUNTING MICRO LED

(71) Applicant: SAMSUNG ELECTRONICS CO., LTD., Suwon-si (KR)

(72) Inventors: Byunghoon Lee, Suwon-si (KR); Jamyeong Koo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 427 days.

(21) Appl. No.: 16/678,106

(22) Filed: Nov. 8, 2019

(65) Prior Publication Data
US 2020/0152845 A1 May 14, 2020

(30) Foreign Application Priority Data

Nov. 9, 2018 (KR) .................. 10-2018-0137505

(51) Int. Cl.
*H01L 33/62* (2010.01)
*H01L 25/075* (2006.01)

(52) U.S. Cl.
CPC .......... *H01L 33/62* (2013.01); *H01L 25/0753* (2013.01)

(58) Field of Classification Search
CPC .......................... H01L 33/62; H01L 25/0753
See application file for complete search history.

(56) References Cited

U.S. PATENT DOCUMENTS

| | | | |
|---|---|---|---|
| 7,446,545 B2 | 11/2008 | Matsunaga | |
| 7,479,702 B2 | 1/2009 | Uang et al. | |
| 7,526,861 B2 | 5/2009 | Uang et al. | |
| 7,598,609 B2 | 10/2009 | Uang et al. | |
| 7,605,474 B2 | 10/2009 | Uang et al. | |
| 7,932,607 B2 | 4/2011 | Uang et al. | |
| 8,147,911 B2 | 4/2012 | Okuda et al. | |

(Continued)

FOREIGN PATENT DOCUMENTS

| JP | 2017-157724 | 9/2017 |
|---|---|---|
| KR | 10-2009-0129386 | 12/2009 |
| WO | 2018/175338 | 9/2018 |

OTHER PUBLICATIONS

International Search Report dated Feb. 28, 2020 in counterpart International Patent Application No. PCT/KR2019/015168.

(Continued)

*Primary Examiner* — Kenneth Parker
*Assistant Examiner* — Christopher A Culbert
(74) *Attorney, Agent, or Firm* — Nixon & Vanderhye P.C.

(57) ABSTRACT

A micro-LED mounting structure includes a first layer having a conductive pad disposed on a surface thereof, a second layer including a first surface, a second surface opposite the first surface and disposed on the surface of the first layer, and a via-hole extending from the conductive pad of the first layer to the first surface and including a conductive material, and a micro-LED disposed on the first surface of the second layer to be electrically connected with the conductive material included in the via-hole. The via-hole includes a first opening in the first surface of the second layer and in which the conductive material is formed, the conductive material of the first surface provides a conductive area on a portion of the first surface of the second layer, and the conductive area and an area within a specified area of the conductive area define a substantially flat surface.

18 Claims, 6 Drawing Sheets

(56) References Cited

U.S. PATENT DOCUMENTS

| | | |
|---|---|---|
| 9,136,425 B2 | 9/2015 | Tajima et al. |
| 9,997,688 B2 | 6/2018 | Takeya et al. |
| 10,026,668 B1 | 7/2018 | Lee et al. |
| 2004/0224148 A1 | 11/2004 | Matsunaga |
| 2006/0141159 A1 | 6/2006 | Okuda et al. |
| 2006/0192577 A1 | 8/2006 | Matsunaga |
| 2006/0249834 A1* | 11/2006 | Uang ................. H01R 4/04 257/700 |
| 2009/0095503 A1 | 4/2009 | Uang et al. |
| 2011/0204395 A1 | 8/2011 | Hong et al. |
| 2015/0034997 A1* | 2/2015 | Tajima ............... H01L 33/06 257/99 |
| 2015/0357523 A1 | 12/2015 | Tajima et al. |
| 2016/0100481 A1 | 4/2016 | Kim |
| 2016/0163940 A1 | 6/2016 | Huang et al. |
| 2017/0250329 A1 | 8/2017 | Takeya et al. |
| 2018/0022968 A1 | 1/2018 | Yoshizawa et al. |
| 2018/0113152 A1 | 4/2018 | Suzuki et al. |
| 2018/0145236 A1 | 5/2018 | Huang et al. |
| 2018/0287030 A1 | 10/2018 | Takeya et al. |
| 2019/0013256 A1 | 1/2019 | Lee et al. |
| 2019/0013351 A1* | 1/2019 | Pfeuffer ............. H01L 33/382 |
| 2019/0244937 A1 | 8/2019 | Honjo et al. |
| 2019/0287949 A1* | 9/2019 | Chong .............. H01L 25/0756 |
| 2020/0035653 A1 | 1/2020 | Chong et al. |

OTHER PUBLICATIONS

Extended European Search Report and Written Opinion dated Oct. 15, 2021 in corresponding European Application No. 19882022.7.

* cited by examiner

MOUNTING STRUCTURE FOR MOUNTING MICRO LED

CROSS-REFERENCE TO RELATED APPLICATION

This application is based on and claims priority under 35 U.S.C. § 119 to Korean Patent Application No. 10-2018-0137505, filed on Nov. 9, 2018, in the Korean Intellectual Property Office, the disclosure of which is incorporated by reference herein its entirety.

BACKGROUND

1. Field

The disclosure relates to a mounting structure for mounting a micro LED.

2. Description of Related Art

Packaging may refer to a process of mounting an electric element on a substrate and making the electric element a product. The packaging has been developed to integrate more elements in a small area. Recently, a structure for mounting a smaller element has been required with the reduction in size of an electric element. An existing electric element (e.g., a macro-scale element) may be mounted on a substrate by placing the electric element on a solder material printed on a portion of the substrate and melting the solder material by a reflow process. Furthermore, a micro-scale electric element may be mounted on a substrate by applying pressure or heat to electrode bumps included in a solder material between the electric element and the substrate.

A micro LED may, for example, be an LED having horizontal and vertical lengths of 100 micrometers or less. The micro LED may have an area that is less than one hundredth that of an existing LED.

The above information is presented as background information only to assist with an understanding of the disclosure. No determination has been made, and no assertion is made, as to whether any of the above might be applicable as prior art with regard to the disclosure.

Electrode bumps included in a solder material for mounting an existing micro LED on a substrate are randomly distributed, and therefore high pressure has to be applied to the solder material to make an actual electrical contact. The solder material subjected to the high pressure may be brought into electrical contact with another portion (e.g., another electrode) of the electric element to cause a problem such as short-circuit. Furthermore, the electrode bumps may have a problem of low reliability because the electrode bumps, when viewed on a macro-scale, provide point contacts between the substrate and the electric element.

SUMMARY

Embodiments of the disclosure address at least the above-mentioned problems and/or disadvantages and to provide at least the advantages described below. Accordingly, an example aspect of the disclosure is to provide a mounting structure for mounting micro elements (e.g., micro LEDs) without a short circuit.

In accordance with an example aspect of the disclosure, a micro LED mounting structure includes a first layer including a conductive pad disposed on a surface of the first layer, a second layer including a first surface, a second surface opposite the first surface and disposed on the surface of the first layer, and a via-hole extending from the conductive pad of the first layer to the first surface of the second layer and including a conductive material therein, and a micro LED disposed on the first surface of the second layer to be electrically connected with the conductive material included in the via-hole, wherein the via-hole includes a first opening in the first surface of the second layer in which the conductive material is provided, the conductive material of the first surface defining a conductive area on a portion of the first surface of the second layer, and the conductive area and an area around the conductive area having a substantially flat surface.

In accordance with another example aspect of the disclosure, a micro LED mounting structure includes a micro LED including an electrode, a base including a conductive pad disposed on a first surface of the base, a film including a first surface on which the micro LED is disposed and a second surface disposed on the first surface of the base, and a via including a via-hole and a conductive filler, the via-hole extending through the film to define a first opening in the first surface of the film and a second opening in the second surface of the film, and the conductive filler being provided in the via-hole and including at least two conductive materials. The conductive filler includes a first end surface and a second end surface at opposite ends of the conductive filler, the first end surface being in contact with the electrode through the first opening and the second end surface being in contact with the conductive pad through the second opening. The first end surface being in substantially the same plane with an area around the first opening in the first surface of the film, and the second end surface being in substantially the same plane with an area around the second opening in the second surface of the film. The conductive filler includes a first portion adjacent to the first end surface, a second portion adjacent to the second end surface, and a third portion between the first portion and the second portion. The at least two conductive materials include a metal material in the first portion, the second portion, and the third portion and a solder material in the first portion and the second portion.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

With regard to the description of the drawings, identical or similar reference numerals may be used to refer to identical or similar components.

DETAILED DESCRIPTION

Hereinafter, various example embodiments of the disclosure will be described with reference to the accompanying drawings. However, those of ordinary skill in the art will recognize that various modifications, equivalents, and/or alternatives on the various embodiments described herein may be variously made without departing from the scope and spirit of the disclosure.

Figure 1:
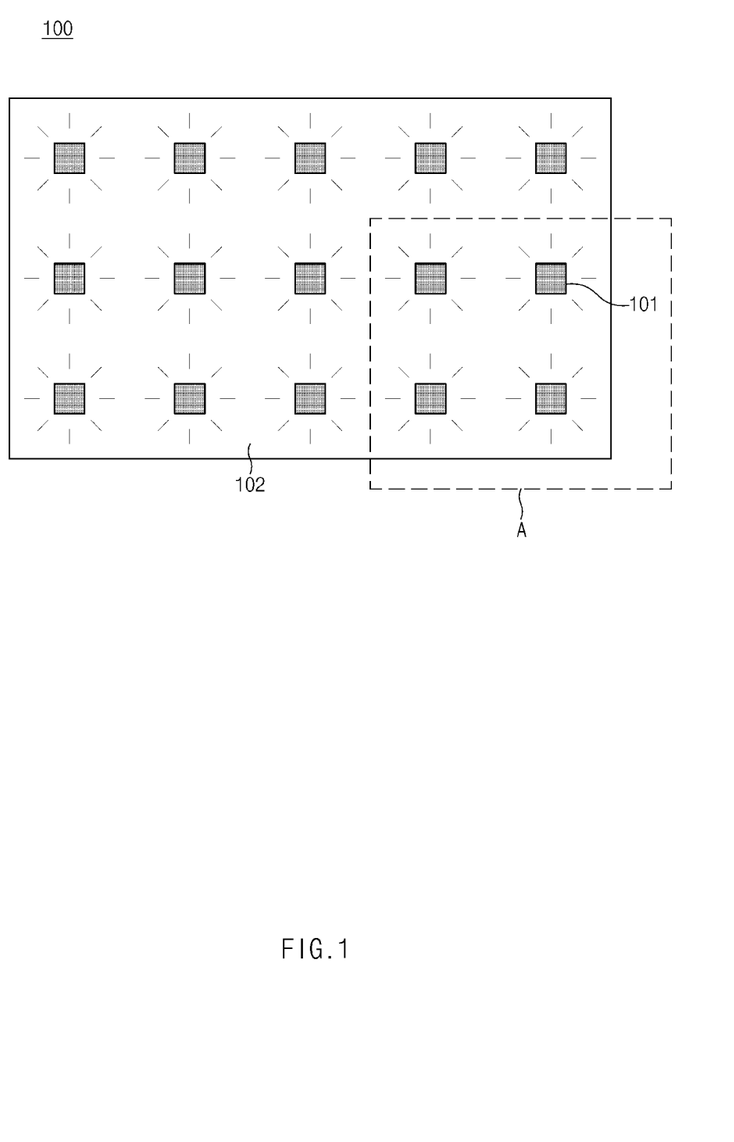
FIG. 1 is a plan view illustrating an example substrate having micro LEDs mounted thereon according to an embodiment.

FIG. 1 is a plan view illustrating an example substrate having micro LEDs mounted thereon according to an embodiment.

Referring to FIG. 1, a micro LED mounting structure 100 according to an embodiment may include a substrate 102 and a plurality of micro LEDs 101 arranged on the substrate 102.

In an embodiment, the substrate 102 may include, for example, and without limitation, a wafer, glass, a printed circuit board, or the like, that includes an insulating material such as, for example, and without limitation, sapphire, silicon, or the like. The plurality of micro LEDs 101 may be arranged on a surface of the substrate 102.

The micro LEDs 101 may refer, for example, to light emitting diodes with a size of tens of micrometers that are too small to be identified with eyes. For example, the micro LEDs 101 may be manufactured to have a length that is around one tenth that of a general light emitting diode (LED) chip and an area that is around one hundredth that of the general LED chip.

The micro LEDs 101 have high response speed, low power consumption, and high luminance and are capable of implementing high resolution and have excellent color, contrast, and brightness. Accordingly, the micro LEDs 101 may accurately represent a wide range of colors and may implement a clear screen even outdoors in bright sunlight. Furthermore, due to high resistance to burn-in and low heat, the micro LEDs 101 ensure a long service life without deformation.

Moreover, the micro LEDs 101 are appropriate for a virtual reality (VR) or augmented reality (AR) field, in which rapidly changing images have to be displayed, because the micro LEDs 101 are capable of rapidly changing colors, for example, in nano-seconds.

Due to the aforementioned characteristics, the micro LEDs 101 have attracted attention as a next-generation display. For example, the micro LEDs 101 may be used in various fields, such as, for example, and without limitation, a lighting device, a bio-contact lens, a medical patch, a medical field, a wearable display, a camera module, a head up display (HUD), or the like, which require low-power consumption, compactness, and light weight.

The micro LEDs 101 mentioned herein may have a length and width of more than 1 micrometer and less than 100 micrometers and may, for example, be manufactured by growing a thin film on a sapphire or silicon substrate using an inorganic material such as, for example, and without limitation, aluminum (Al), gallium (Ga), nitrogen (N), phosphorus (P), arsenic (As), indium (In), or the like.

The mounting structure 100 for mounting the micro LEDs 101 according to an embodiment may refer, for example, to a way of fusing the micro LEDs 101 to the substrate 102 using electrode patterns on mounting surfaces of the micro LEDs 101 without an additional connecting structure such as a metal lead or an intermediate medium such as an array of electrode bumps.

In the mounting structure 100 for mounting the micro LEDs 101 according to an embodiment, two electrodes may be disposed on the substrate 102 so as not to overlap each other and may therefore not hide light emitted from another micro LED 101. Furthermore, the mounting structure 100 does not require an intermediate medium such as a wire and therefore has an advantage in compactness, light weight, and high integration.

Figure 2:
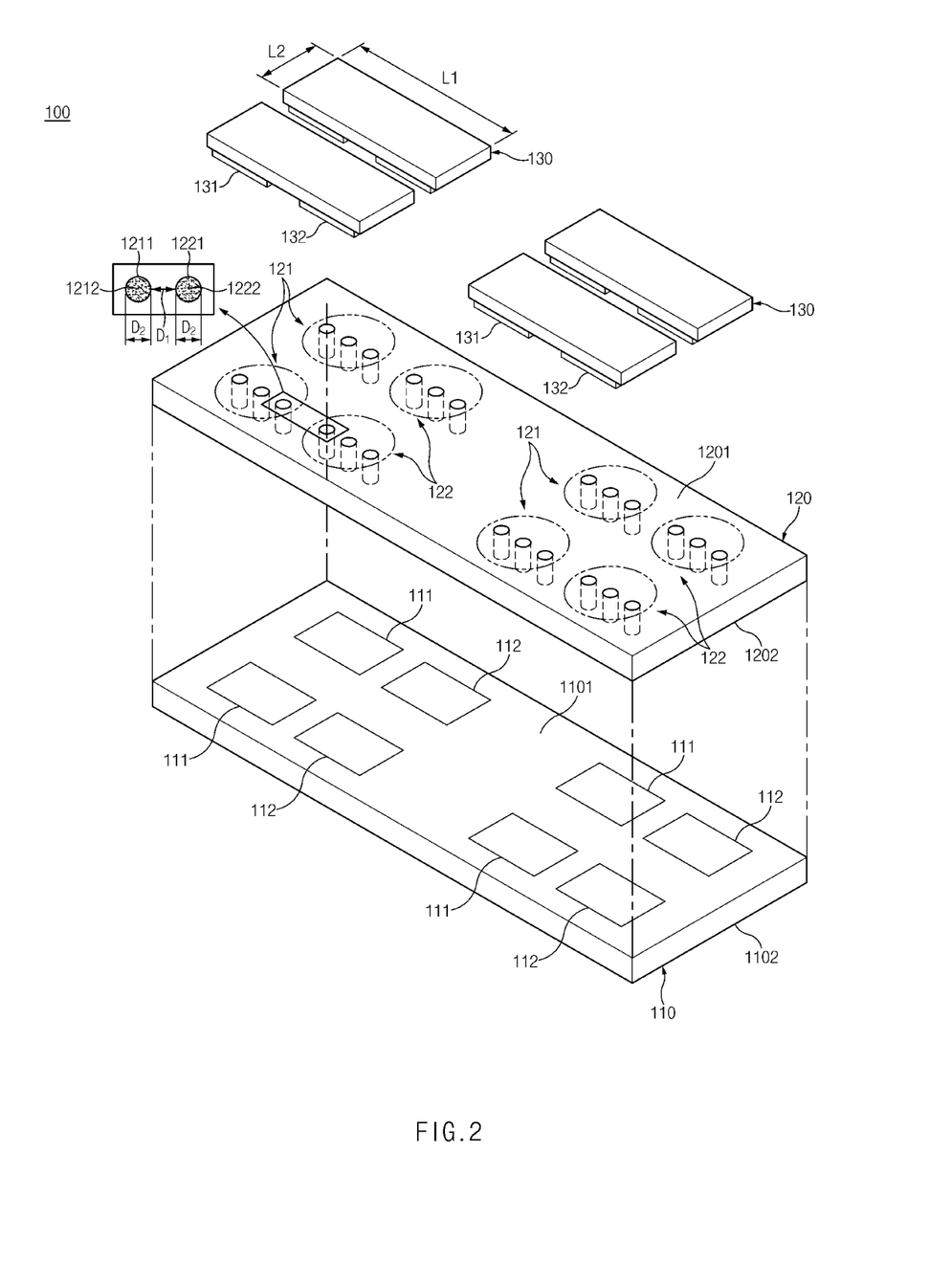
FIG. 2 is an exploded perspective view illustrating an example micro LED mounting structure according to an embodiment.

FIG. 2 is an exploded perspective view illustrating an example micro LED mounting structure 100 according to an embodiment.

The micro LED mounting structure 100 according to an embodiment may include a first layer 110, a second layer 120 stacked on the first layer 110, and a plurality of micro LEDs 130 (e.g., the micro LEDs 101 of FIG. 1) that are arranged on the second layer 120.

The plurality of micro LEDs 130 may have a horizontal length L1 and a vertical length L2 that are more than 1 micrometer and less than 100 micrometers.

In an embodiment, the first layer 110 may include an insulating material. The first layer 110 may include a first surface 1101 facing a first direction, a second surface 1102 opposite the first surface 1101, and conductive pads 111 and 112 formed on the first surface 1101. The second layer 120 may be disposed on the first surface 1101 of the first layer 110. The conductive pads 111 and 112 may be formed on the first surface 1101 facing the second layer 120. The conductive pads 111 and 112 and areas around the conductive pads 111 and 112 may form a substantially flat surface. For example, the conductive pads 111 and 1112 may be printed on the first surface 1101 of the first layer 110 to have a small thickness.

The conductive pads 111 and 112 may include the first conductive pads 111 and the second conductive pads 112 electrically isolated from the first conductive pads 111. The first conductive pads 111 and the second conductive pads 112 may form portions of the first surface 1101 of the first layer 110 and, as described above, may form a substantially flat surface. For example, the first conductive pads 111 and the second conductive pads 112 may be formed not to be higher or lower than the surrounding areas thereof. The first conductive pads 111 and the second conductive pads 112 may be formed on the first surface 1101 of the first layer 110 to be spaced apart from each other by a predetermined gap. The distance by which the first conductive pads 111 and the second conductive pads 112 are spaced apart from each other may vary depending on the size of the micro LEDs 130 or the diameter of a plurality of vias included in first vias 121 and second vias 122.

In an embodiment, the first conductive pads 111 may be electrically connected with first electrodes 131 included in the micro LEDs 130 through the first vias 121. In an embodiment, the second conductive pads 112 may be electrically connected with second electrodes 132 included in the micro LEDs 130 through the second vias 122. The second conductive pads 112 may be electrically connected with a ground area (not illustrated) that is included in the first layer 110.

In the illustrated embodiment, the first conductive pads 111 and the second conductive pads 112 are illustrated in a rectangular shape. However, without being necessarily limited thereto, the first conductive pads 111 and the second conductive pads 112 may be formed in various shapes.

In some embodiments, the first layer 110 may include a printed circuit board, and the first conductive pads 111 and the second conductive pads 112 may be formed of a conductive material printed on the printed circuit board.

In some embodiments, the first layer 110 may include a wafer, and the first conductive pads 111 and the second conductive pads 112 may include a conductive material deposited on the wafer. The first conductive pads 111 and the second conductive pads 112 may be deposited on etched partial areas of the wafer. The wafer may include, for example, and without limitation, silicon, glass, and/or sapphire, or the like.

In an embodiment, the second layer 120 may be made of an insulating material. The second layer 120 may include a first surface 1201 facing the first direction, a second surface 1202 opposite the first surface 1201 and disposed on the first surface 1101 of the first layer 110, and the plurality of vias 121 and 122 formed through the first surface 1201 from the second surface 1202.

In an embodiment, the vias 121 and 122 may include the first vias 121 that electrically connect the first conductive pads 111 of the first layer 110 and the first electrodes 131 of the micro LEDs 130 and the second vias 122 that electrically connect the second conductive pads 112 of the first layer 110 and the second electrodes 132 of the micro LEDs 130.

In various embodiments, the vias 121 and 122 may each include a via-hole (e.g., a via-hole 210 of FIG. 4) that is formed through the first surface 1201 from the second surface 1202 of the second layer 120 and a conductive filler (e.g., a conductive filler 220 of FIG. 4) that is included in the via-hole and includes a conductive material.

The via-holes may form openings 1211 and 1221 in the first surface 1201 of the second layer 120. End surfaces of the conductive fillers may be exposed on the first surface 1201 of the second layer 120 through the openings 1211 and 1221 to form contact surfaces 1212 and 1222 that are brought into contact with the electrodes included in the micro LEDs 130. The openings 1211 and 1221 may be spaced apart from each other by a predetermined gap D1.

In various embodiments, the contact surfaces 1212 and 1222 formed in the openings 1211 and 1221 and areas around the contact surfaces 1212 and 1222 may form a substantially flat surface. The substantially flat surface may refer, when viewed on a macro-scale, to the conductive materials forming the contact surfaces 1212 and 1222 form a thin layer without substantially protruding from the surface of the second layer 120.

In some embodiments, conductive areas (e.g., the contact surfaces 1212 and 1222) formed on a surface (e.g., the first surface 1201) of the second layer 120 may have a size (e.g., a diameter of D2) that substantially corresponds to the size of the openings 1211 and 1221 formed in the surface of the second layer 120 by the vias 121 and 122. The conductive materials included in the vias 121 and 122 may be formed in only areas corresponding to the openings 1211 and 1221 formed in the surface (e.g., the first surface 1201) of the second layer 120 and may not be formed in the remaining area.

In general, a solder material for mounting an electric element may be formed to protrude from a surface of a substrate. The protruding portion may be brought into electrical contact with the electric element while being spread on the surface of the substrate by heat or pressure. This structure may cause a short circuit between electrodes in mounting a micro element such as a micro LED with a size of tens of micrometers. For example, the electrodes included in the micro element may be formed to be spaced apart from each other by a gap of only tens to hundreds of nanometers.

On the other hand, in the micro LED mounting structure 100 according to the embodiment, the conductive areas (e.g., the contact surfaces 1212 and 1222) exposed on the surface of the second layer 120 through the openings 1211 and 1221 formed by the vias 121 and 122 may form substantially the same plane with the first surface 1201 of the second layer 120.

Accordingly, the conductive areas (e.g., the contact surfaces 1212 and 1222) may not be widened even though the electrodes 131 and 132 of the micro LEDs 130 are fused to the conductive areas (e.g., the contact surfaces 1212 and 1222). Furthermore, a short circuit between a conductive area (e.g., the contact surface 1212) making contact with one electrode and a conductive area (e.g., the contact surface 1222) making contact with at least one other electrode may be prevented and/or reduced. For example, the conductive areas (e.g., the contact surfaces 1212 and 1222) may be formed to have a size substantially corresponding to the size of the openings 1211 and 1221 formed in the first surface 1201 of the second layer 120 (e.g., a diameter corresponding to the diameter D2 of the openings 1211 and 1221).

In various embodiments, the second layer 120 may include a polymer material including PET and/or PI, may be made of a porous material including, for example, and without limitation, anodic aluminum oxide, may include a ceramic material, or may include non-conductive glass.

Figure 3:
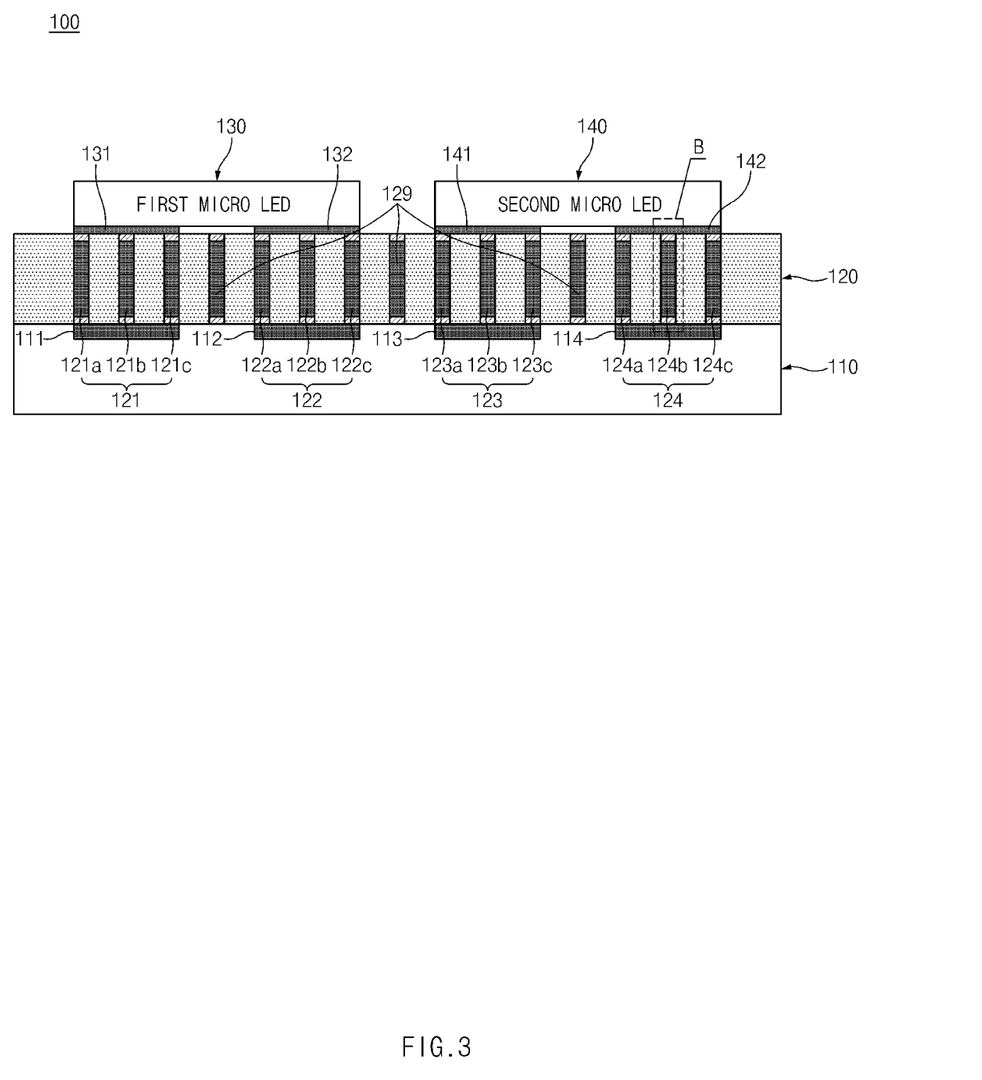
FIG. 3 is a sectional view illustrating an example micro LED mounting structure according to an embodiment.

FIG. 3 is a sectional view illustrating an example micro LED mounting structure 100 according to an embodiment.

In an embodiment, the micro LED mounting structure 100 may include the first layer 110, a plurality of micro LEDs 130 and 140, and the second layer 120 disposed between the plurality of micro LEDs 130 and 140 and the first layer 110.

In various embodiments, the first layer 110 may include a plurality of layers, and at least one of the plurality of layers may include a ground area. The ground area may be electrically connected with one of electrodes included in the plurality of micro LEDs 130 and 140.

Referring to FIG. 3, the plurality of micro LEDs 130 and 140 may include the first micro LED 130 disposed on the first surface 1201 of the second layer 120 and the second micro LED 140 disposed on the first surface 1201 of the second layer 120 and spaced apart from the first micro LED 130 by a predetermined gap.

In the illustrated embodiment, the first micro LED 130 may include the first electrode 131 electrically connected with the first via 121 formed in the second layer 120 and the second electrode 132 electrically connected with the second via 122 formed in the second layer 120. The first electrode 131 may make contact with sub-vias 121a, 121b, and 121c included in the first via 121. The second electrode 132 may make contact with sub-vias 122a, 122b, and 122c included in the second via 122. The sub-vias 121a, 121b, and 121c may be electrically isolated from the sub-vias 122a, 122b, and 122c. The sub-vias 121a, 121b, and 121c may be electrically connected through the first conductive pad 111 and the first electrode 131. The sub-vias 122a, 122b, and 122c may be electrically connected through the second conductive pad 112 and the second electrode 132. The sub-vias 121a, 121b, and 121c may connect the first conductive pad 111 and the first electrode 131 in parallel. The sub-vias 122a, 122b, and 122c may connect the second conductive pad 112 and the second electrode 132 in parallel. An identical first signal may flow through the sub-vias 121a, 121*b*, and 121*c*. An identical second signal may flow through the sub-vias 122*a*, 122*b*, and 122*c*.

An electrical signal may form a closed circuit while flowing from the first conductive pad 111 to the ground area through the first via 121, the first electrode 131, a light emitting part included in the first micro LED 130, the second electrode 132, the second via 122, and the second conductive pad 112.

In various embodiments, the first via 121 and the second via 122 may each include a plurality of sub-vias. For example, the first via 121 may include the first sub-via 121*a*, the second sub-via 121*b*, and the third sub-via 121*c*. The sub-vias 121*a*, 121*b*, and 121*c* may extend from the second surface 1202 of the second layer 120 to the first surface 1201 of the second layer 120. The sub-vias 121*a*, 121*b*, and 121*c* may electrically connect the first conductive pad 111 disposed on the second surface 1202 of the second layer 120 and the first electrode 131 of the first micro LED 130 disposed on the first surface 1201 of the second layer 120.

For example, the second via 122 may include the first sub-via 122*a*, the second sub-via 122*b*, and the third sub-via 122*c*. The sub-vias 122*a*, 122*b*, and 122*c* may extend from the second surface 1202 of the second layer 122 to the first surface 1201 of the second layer 120. The sub-vias 122*a*, 122*b*, and 122*c* may electrically connect the second conductive pad 112 disposed on the second surface 1202 of the second layer 120 and the second electrode 132 of the first micro LED 130 disposed on the first surface 1201 of the second layer 120.

The sub-vias 121*a*, 121*b*, and 121*c* included in the first via 121 may be electrically connected together and may transmit the identical first signal. The sub-vias 122*a*, 122*b*, and 122*c* included in the second via 122 may be electrically connected together and may transmit the identical second signal.

In the illustrated embodiment, the sub-vias 121*a*, 121*b*, and 121*c* included in the first via 121 may be electrically isolated from the sub-vias 122*a*, 122*b*, and 122*c* included in the second via 122. For example, the third sub-via 121*c* formed adjacent to the second via 122 among the sub-vias 121*a*, 121*b*, and 121*c* included in the first via 121 may be spaced a predetermined gap apart from the first sub-via 122*a* formed adjacent to the first via 121 among the sub-vias 122*a*, 122*b*, and 122*c* included in the second via 122. For example, the predetermined gap may be tens to hundreds of nanometers.

In various embodiments, the first via 121 and the second via 122 may each include the plurality of sub-vias, thereby improving the reliability of the micro LEDs 130 and 140. For example, in the case where the first via 121 and the second via 122 each include only one sub-via (e.g., the first sub-via 121*a* or 122*a*), no signal can be transmitted to the micro LED electrically connected with the one sub-via when the one sub-via (e.g., the first sub-via 121*a* or 122*a*) is faulty or damaged. For example, vias for a micro LED that have a size of tens of nanometers or less may be more likely to have a defect in the manufacturing process.

Accordingly, the micro LED mounting structure 100 according to the embodiment may include the vias 121 and 122, each of which includes the plurality of sub-vias, thereby improving the reliability and reducing the defect rate.

In FIGS. 2 and 3, the first via 121 and the second via 122 are illustrated as including the three sub-vias. However, without being necessarily limited thereto, the first via 121 and the second via 122 may include at least two sub-vias.

In the illustrated embodiment, the second micro LED 140 may include a third electrode 141 electrically connected with a third via 123 formed in the second layer 120 and a fourth electrode 142 electrically connected with a fourth via 124 formed in the second layer 120. The third electrode 141 may make contact with sub-vias 123*a*, 123*b*, and 123*c* included in the third via 123. The fourth electrode 142 may make contact with sub-vias 124*a*, 124*b*, and 124*c* included in the fourth via 124.

The sub-vias 123*a*, 123*b*, and 123*c* and the sub-vias 124*a*, 124*b*, and 124*c* may be electrically isolated from each other. The sub-vias 123*a*, 123*b*, and 123*c* may be electrically connected through a third conductive pad 113 and the third electrode 141. The sub-vias 124*a*, 124*b*, and 124*c* may be electrically connected through a fourth conductive pad 114 and the fourth electrode 142. The sub-vias 123*a*, 123*b*, and 123*c* may connect the third conductive pad 113 and the third electrode 141 in parallel. The sub-vias 124*a*, 124*b*, and 124*c* may connect the fourth conductive pad 114 and the fourth electrode 142 in parallel. An identical first signal may flow through the sub-vias 123*a*, 123*b*, and 123*c*. An identical second signal may flow through the sub-vias 124*a*, 124*b*, and 124*c*.

In the illustrated embodiment, the sub-vias 123*a*, 123*b*, and 123*c* included in the third via 123 may be electrically isolated from the sub-vias 124*a*, 124*b*, and 124*c* included in the fourth via 124. For example, the third sub-via 123*c* formed adjacent to the fourth via 124 among the sub-vias 123*a*, 123*b*, and 123*c* included in the third via 123 may be spaced a predetermined gap apart from the first sub-via 124*a* formed adjacent to the third via 123 among the sub-vias 124*a*, 124*b*, and 124*c* included in the fourth via 124. For example, the predetermined gap may be tens to hundreds of nanometers.

In an embodiment, the micro LED mounting structure 100 may have a closed circuit extending from the first conductive pad 111 to the ground area (not illustrated) through the first via 121, the first electrode 131, the light emitting part (not illustrated) that is included in the first micro LED 130, the second electrode 132, the second via 122, and the second conductive pad 112. Likewise, the micro LED mounting structure 100 may have a closed circuit extending from the third conductive pad 113 to the ground area (not illustrated) through the third via 123, the third electrode 141, a light emitting part (not illustrated) that is included in the second micro LED 140, the fourth electrode 142, the fourth via 124, and the fourth conductive pad 114.

In various embodiments, a predetermined potential difference may be formed between the first electrode 131 and the second electrode 132 and between the third electrode 141 and the fourth electrode 142. The potential difference may correspond to a voltage signal for causing the micro LEDs 130 and 140 to emit light.

In the illustrated embodiment, the micro LED mounting structure 100 may further include a fifth via 129 formed in the second layer 120. The fifth via 129 may be electrically isolated from the first via 121, the second via 122, the third via 123, and the fourth via 124. Referring to the drawing, the fifth via 129 may not make contact with the conductive pads 111, 112, 113, and 114 formed on the first layer 110 or the electrodes 131, 132, 141, and 142 included in the micro LEDs 130 and 140. For example, the fifth via 129 may not be associated with operation of the micro LEDs 130 and 140. The fifth via 129 may not be included the closed circuits described above. However, likewise to the other vias, the fifth via 129 may include a conductive material.

As will be described with reference to FIGS. 5 and 6, the first to fifth vias 121, 122, 123, 124, and 129 may be formed by filling a plurality of holes formed in the second layer 120 with a conductive material. However, some (e.g., the first to fourth vias 121, 122, 123, and 124) of the plurality of vias may make contact with the electrodes of the micro LEDs 130 and 140, and the remainder (e.g., the fifth via 129) may not be electrically connected with the micro LEDs 130 and 140. In various embodiments, the number or arrangement of fifth vias 129 may vary depending on the size of the micro LEDs 130 and 140, the gap between the electrodes 131, 132, 141, and 142, and/or the gap between the sub-vias.

Figure 4:
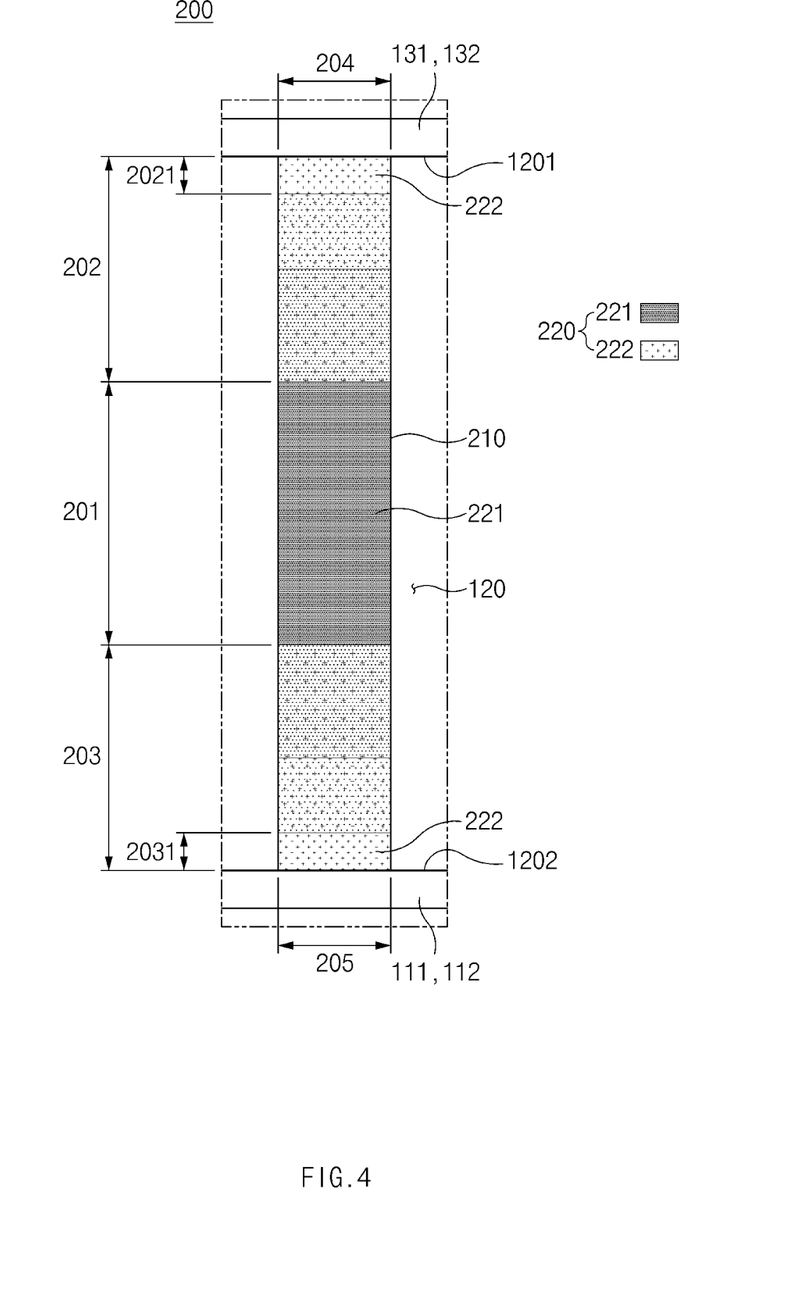
FIG. 4 is a diagram illustrating a via of an example micro LED mounting structure according to an embodiment.

FIG. 4 is a diagram illustrating an example via 200 of the micro LED mounting structure according to an embodiment.

Referring to FIG. 4, the via 200 (e.g., the first to fifth vias 121, 122, 123, 124, and 129 illustrated in FIG. 3) may include a central portion 201 formed in the second layer 120, a first portion 202 formed between the central portion 201 and the electrode 131 or 132 of a micro LED (e.g., the first micro LED 130 illustrated in FIG. 3), and a second portion 203 formed between the central portion 201 and the conductive pad 111 or 112 formed on a first layer (e.g., the first layer 110 of FIG. 3).

In the illustrated embodiment, the via 200 may include a first conductive material 221 formed in the central portion 201, the first portion 202, and the second portion 203, and a second conductive material 222 mainly formed in the first portion 202 and the second portion 203. For example, the first conductive material 221 may be mainly formed in the central portion 201 and may be less formed from the central portion 201 to the first portion 202 or the second portion 203.

In various embodiments, the first conductive material 221 may include a metal material. The metal material may include, for example, and without limitation, at least one of copper (Cu), nickel (Ni), and silver (Ag). The second conductive material 222 may include a solder material. The solder material may include, for example, and without limitation, at least one of tin (Sn), lead (Pb), copper (Cu), silver (Ag), gold (Au), indium (In), bismuth (Bi), and nickel (Ni).

Referring to FIG. 4, the via 200 may include the via-hole 210 formed in the second layer 120 and the conductive filler 220 made of the conductive materials 221 and 222 included in the via-hole 210. The via-hole 210 may form a first opening 204 in the first surface 1201 of the second layer 120 and may form a second opening 205 in the second surface 1202 of the second layer 120.

The first conductive material 221 may include the metal material. The second conductive material 222 may include the solder material.

The conductive filler 220 may form a first contact surface 2021 exposed on the first surface 1201 of the second layer 120 through the first opening 204 and a second contact surface 2031 exposed on the second surface 1202 of the second layer 120 through the second opening 205. Part of the solder material may be formed on the first contact surface 2021 and the second contact surface 2031, and the metal material may be formed between the first contact surface 2021 and the second contact surface 2031.

In various embodiments, the first contact surface 2021 and the second contact surface 2031 may form substantially the same planes with the areas around the first opening 204 and the second opening 205, respectively.

In various embodiments, the ratio of the solder material (e.g., 222) to the metal material (e.g., 221) may be increased with an approach to the first contact surface 2021 and the second contact surface 2031. A mixture and/or a compound in which the element of the metal material and the element of the solder material are mixed at a predetermined ratio may be formed between the central portion 201 made of the metal material and the contact surfaces 2021 and 2031.

In various embodiments, the conductive filler 220 may include at least two conductive materials (e.g., a metal material or a solder material). In the first portion 202 including the first contact surface 2021 formed at one end of the conductive filler 220 and the second portion 203 including the second contact surface 2031 formed at an opposite end of the conductive filler 220, the ratio of the solder material to the metal material may be greater than that in the central portion 201, and the ratio of the solder material to the metal material may be small in the central portion 201.

In various embodiments, the conductive filler 220 may be formed such that the ratio of the solder material to the metal material is increased with an approach to a surface (e.g., the first surface 1202 or the second surface 1202) of the second layer 120.

In some embodiments, the via 200 may include the via-hole 210 formed in the first direction and the conductive filler 220 formed in the via-hole 210. The conductive filler 220 may include a metal material as a whole, and opposite end portions (e.g., the first portion 202 and the second portion 203) of the conductive filler 220 in the first direction may further include a solder material.

Figure 5:
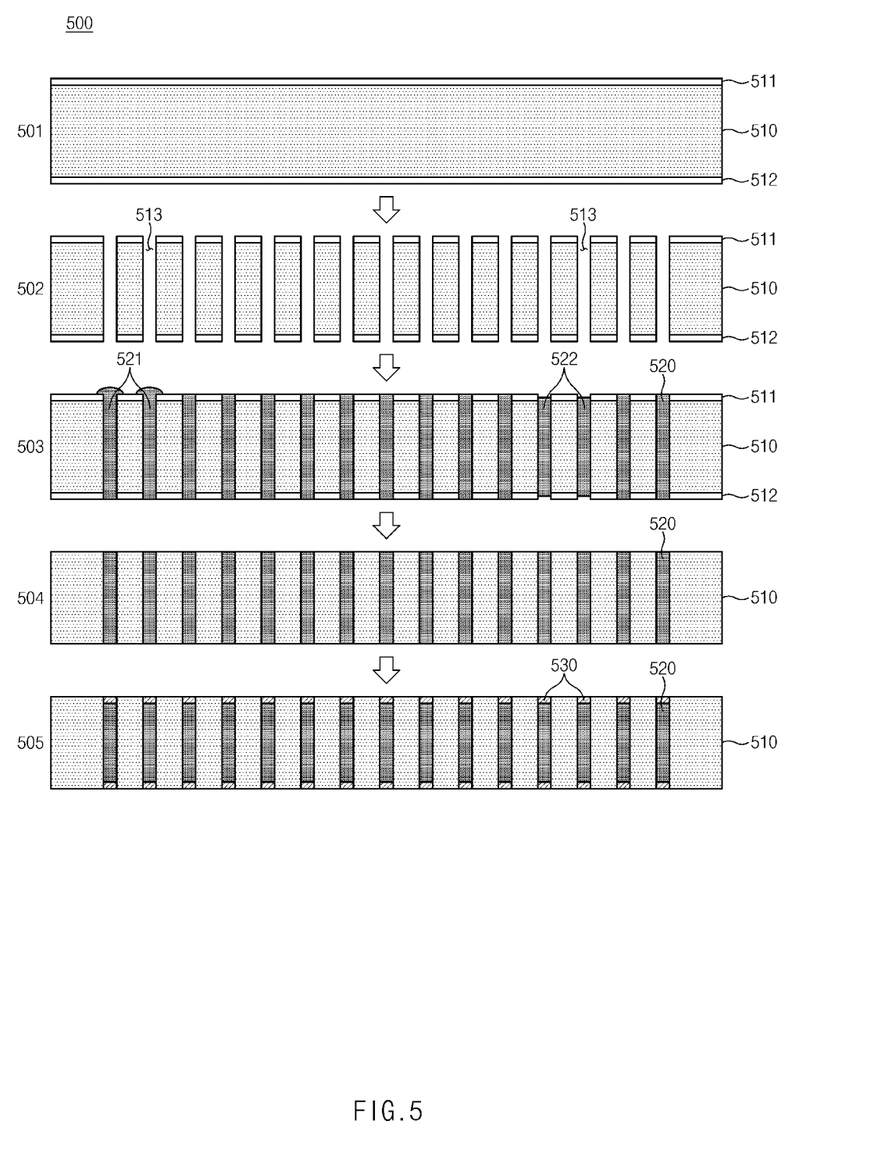
FIG. 5 is a diagram illustrating an example method for manufacturing a second layer of the micro LED mounting structure according to an embodiment.

FIG. 5 is a diagram illustrating an example method for manufacturing the second layer (e.g., a film) of the micro LED mounting structure according to an embodiment.

Referring to FIG. 5, in process 501, a first cover layer 511 may be formed on a first surface of a film 510, and a second cover layer 512 may be formed on a second surface of the film 510. The first cover layer 511 and the second cover layer 512 may be made of a material different from that of the film 510. The film 510, the first cover layer 511, and the second cover layer 512 may have chemical resistance so as not be damaged in a plating process that is performed in process 503 and/or 505. For example, the film 510 may include a polymer material such as, for example, and without limitation, PI or PET. For example, the film 510 may include a porous material such as, for example, and without limitation, anodic aluminum oxide. For example, the film 510 may include porous ceramic. For example, the film 510 may include non-conductive glass.

In process 502, via-holes 513 may be formed through the first cover layer 511, the film 510, and the second cover layer 512. The via-holes 513 may be formed, for example, by laser etching or laser drilling. The diameter of the via-holes 513 may be determined depending on the size of electrodes of micro elements (e.g., micro LEDs) mounted on the film 510. For example, the via-holes 513 may be formed such that each of the electrodes corresponds to at least two via-holes 513. Accordingly, the reliability of electrical connection with the micro elements through the via-holes 513 may be ensured.

In process 503, the via-holes 513 may be filled with a metal material 520. The via-holes 513 may be filled with the metal material 520 by, for example, a plating process or a process of inserting the metal material 520 into the via-holes 513 together with a paste. In process 503, vias may include vias 521 formed in some of the via-holes 513 by the metal material 520 that overflows the surfaces of the cover layers 511 and 512 from the via-holes 513, and vias 522 having an air gap formed by incompletely filling the via-holes 513 with the metal material 520.

In process 504, the first cover layer 511 formed on the first surface of the film 510 and the second cover layer 512 formed on the second surface of the film 510 may be removed. Accordingly, the vias 521 in which the metal material 520 extends from the interiors of the via-holes 513 to the surfaces of the cover layers 511 and 512 and/or the vias 522 having the air gap may be formed into vias that include the metal material 520 with which the via-holes 513 are filled to a predetermined height. The predetermined height may correspond to the thickness of the film 510. The metal material 520, with which the via-holes 513 are filled to the predetermined height, may form conductive fillers.

In process 505, part of the metal material 520 may be replaced with a solder material 530. The metal material 520 formed at opposite ends of each via-hole 513 may be replaced with the solder material 530. The replacement may be performed, for example, by a plating process. The replacement may be performed such that atoms of the solder material 530 are bonded to the places from which atoms of the metal material 520 are removed. Accordingly, the height of the conductive fillers formed in the via-holes 513 may substantially correspond to the thickness of the film 510 even though the solder material 530 is additionally included in the via-holes 513. The solder material 530 may include, for example, and without limitation, at least one of tin (Sn), lead (Pb), copper (Cu), silver (Ag), gold (Au), indium (In), bismuth (Bi), and nickel (Ni).

Figure 6:
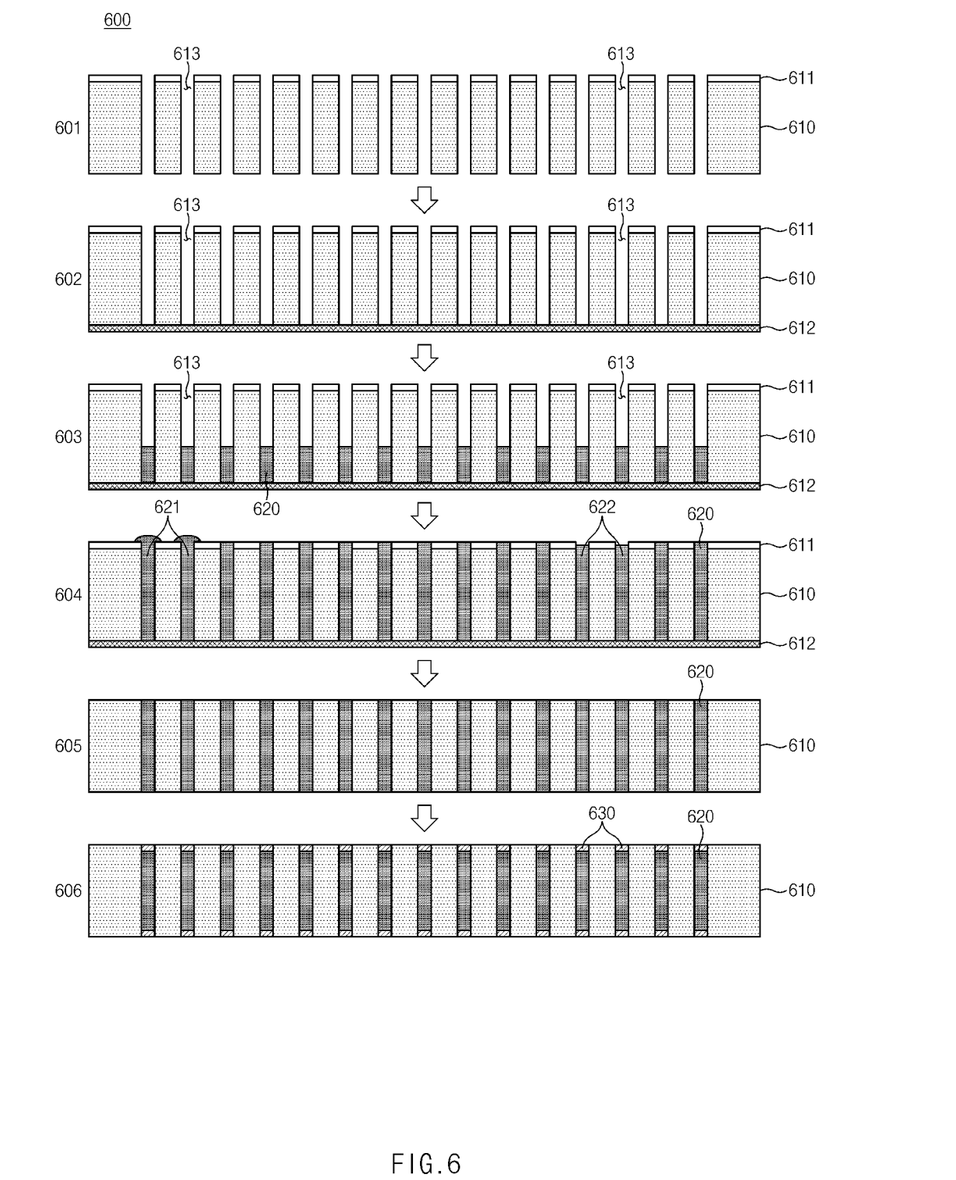
FIG. 6 is a diagram illustrating another example method for manufacturing the second layer of the micro LED mounting structure according to an embodiment.

FIG. 6 is a diagram illustrating another example method for manufacturing the second layer of the micro LED mounting structure according to an embodiment.

Referring to FIG. 6, in process 601, via-holes 613 may be formed through a film 610 and a cover layer 611 formed on a first surface of the film 610. The film 610 and the cover layer 611 may correspond to a state in which only a second cover layer (e.g., the second cover layer 512 of FIG. 5) is removed after processes 501 and 502 of FIG. 5.

In process 602, a seed layer 612 may be deposited on a second surface of the film 610. The seed layer 612 may be formed, for example, by physical vapor deposition (PVD) or chemical vapor deposition (CVD).

In process 603, the via-holes 613 may be filled with a metal material 620. The via-holes 613 may be filled with the metal material 620 by a plating process or a process of inserting the metal material 620 into the via-holes 613 together with a paste.

In process 604, vias may include vias 621 formed in some of the via-holes 613 by the metal material 620 that overflows the surface of the cover layer 611 from the via-holes 613, and vias 622 having an air gap formed by incompletely filling the via-holes 613 with the metal material 620. Unlike in process 504 of FIG. 5, the via-holes 613 may be filled with the metal material 620 through only openings formed in the first surface of the film 610.

In operation 605, the cover layer 611 formed on the first surface of the film 610 and the seed layer 612 formed on the second surface of the film 610 may be removed. Accordingly, the vias 621 in which the metal material 620 extends to the surface of the cover layer 611 and/or the vias 622 having the air gap may be formed into vias that include the metal material 620 with which the via-holes 613 are filled to a predetermined height. The predetermined height of the metal material 620 may correspond to the thickness of the film 610. The metal material 620, with which the via-holes 613 are filled to the predetermined height, may form conductive fillers.

In process 606, a plating process using a solder material 630 may be performed on the film 610 from which the seed layer 612 is removed. The metal material 620 formed at opposite ends of each via-hole 613 may be replaced with the solder material 630. Accordingly, the height of the conductive fillers formed in the via-holes 613 may substantially correspond to the thickness of the film 610 even though the solder material 630 is additionally included in the via-holes 613. The solder material 630 may include, for example, and without limitation, at least one of tin (Sn), lead (Pb), copper (Cu), and nickel (Ni).

The micro LED mounting structure according to example embodiments of the disclosure includes a structure appropriate for a micro process, thereby improving the reliability in mounting an element. For example, the micro LED mounting structure according to the embodiments of the disclosure may prevent a short circuit between electrodes included in a micro LED. The micro LED mounting structure is applicable not only to a micro LED but also to various micro parts having a size similar to that of the micro LED.

In addition, the disclosure may provide various effects that are directly or indirectly recognized.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related components. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if a component (e.g., a first component) is referred to, with or without the term "operatively" or "communicatively", as "coupled with," "coupled to," "connected with," or "connected to" another component (e.g., a second component), the component may be coupled with the other component directly (e.g., wiredly), wirelessly, or via a third component.

According to the situation, the expression "adapted to or configured to" used herein may be interchangeably used with, for example, the expression "suitable for", "having the capacity to", "changed to", "made to", "capable of" or "designed to" in hardware or software or any combination thereof. The expression "a device configured to" may refer to a situation in which the device is "capable of" operating together with another device or other components. For example, a "processor configured to (or set to) perform A, B, and C" may refer, for example, and without limitation, to a dedicated processor (e.g., an embedded processor) for performing corresponding operations or a generic-purpose processor (e.g., a central processing unit (CPU) or an application processor) which performs corresponding operations by executing one or more software programs which are stored in a memory device (e.g., the memory 130).

The term "module" used herein may include a unit, which is implemented with hardware, software, or firmware, and may be interchangeably used with the terms "logic", "logical block", "component", "circuit", or the like. The "module" may be a minimum unit of an integrated component or a part thereof or may be a minimum unit for performing one or more functions or a part thereof. The "module" may be implemented mechanically or electronically and may include, for example, an application-specific IC (ASIC)

chip, a field-programmable gate array (FPGA), and a programmable-logic device for performing some operations, which are known or will be developed.

According to various embodiments, at least a part of an apparatus (e.g., modules or functions thereof) or a method (e.g., operations) may be, for example, implemented by instructions stored in a computer-readable storage media (e.g., the memory 130) in the form of a program module. The instruction, when executed by a processor (e.g., a processor 120), may cause the processor to perform a function corresponding to the instruction. The computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), an embedded memory, and the like. The one or more instructions may contain a code made by a compiler or a code executable by an interpreter.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments thereof, it will be understood by those skilled in the art that various changes in form and details may be made therein without departing from the spirit and scope of the disclosure as may be defined, for example, by the appended claims and their equivalents.

What is claimed is:

1. A micro LED mounting structure comprising:
   a first layer having a conductive pad disposed on a surface of the first layer;
   a second layer including a first surface, a second surface opposite the first surface and disposed on the surface of the first layer, and a via-hole formed through a portion of the first surface from a portion of the second surface and including a conductive material therein; and
   a micro LED disposed on the first surface of the second layer to be electrically connected with the conductive material included in the via-hole,
   wherein the conductive material includes a first conductive material and a second conductive material different from the first conductive material,
   wherein the via-hole includes a first portion adjacent to the first surface, a second portion adjacent to the second surface, and a third portion between the first portion and the second portion,
   wherein a portion of the conductive material disposed in the third portion is configured to have a mixture including the first conductive material and the second conductive material with a first ratio of the second conductive material to the first conductive material, and a portion of the conductive material disposed in the first portion and the second portion is configured to have a mixture including the first conductive material and the second conductive material with a second ratio of the second conductive material to the first conductive material that is higher than the first ratio,
   wherein the via-hole includes a first opening in the first surface of the second layer,
   wherein at least portion of the conductive material disposed in the first portion exposed to the first surface through the first opening and forms a conductive area in contact with the micro LED on a portion of the first surface of the second layer, and
   wherein the conductive area and an area within a specified area of the conductive area define a substantially flat surface, and
   wherein one or more portions of the conductive material between the third portion and the first portion and/or between the third portion and the second portion have a ratio of the second conductive material to the first conductive material that is between the first ratio and the second ratio.

2. The micro LED mounting structure of claim 1, wherein a first plurality of portions of the conductive material are included between the third portion and the first portion and each portion of the first plurality of portions of the conductive material has a different ratio of the second conductive material to the first conductive material, and
   wherein a second plurality of portions of the conductive material are included between the third portion and the second portion and each portion of the second plurality of portions of the conductive material has a different ratio of the second conductive material to the first conductive material.

3. The micro LED mounting structure of claim 1, wherein the conductive area is electrically connected with the micro LED.

4. The micro LED mounting structure of claim 1, wherein the first surface of the second layer faces a first direction, and
   wherein the via-hole extends from the second surface of the second layer to the first surface of the second layer in the first direction.

5. The micro LED mounting structure of claim 1, wherein the second conductive material includes a solder material including at least one of tin (Sn), lead (Pb), copper (Cu), silver (Ag), gold (Au), indium (In), bismuth (Bi), and nickel (Ni).

6. The micro LED mounting structure of claim 1, wherein the first conductive material includes at least one of copper (Cu), nickel (Ni), and silver (Ag).

7. The micro LED mounting structure of claim 1, wherein the conductive pad includes a first conductive pad and a second conductive pad electrically isolated from the first conductive pad,
   wherein the conductive area includes a first conductive area and a second conductive area electrically isolated from the first conductive area, and
   wherein the via-hole includes a first via-hole configured to electrically connect the first conductive area and the first conductive pad and a second via-hole configured to electrically connect the second conductive area and the second conductive pad.

8. The micro LED mounting structure of claim 7, wherein the first via-hole and the second via-hole each include a plurality of via-holes.

9. The micro LED mounting structure of claim 7, wherein the first layer includes a ground area, and
wherein at least one of the first conductive pad and the second conductive pad is electrically connected with the ground area.

10. The micro LED mounting structure of claim 1, wherein the micro LED includes a first side and a second side at a predetermined angle and that have a length of 100 micrometers or less, when the first surface of the second layer is viewed from above, and
wherein the via-hole has a diameter of 20 micrometers or less.

11. The micro LED mounting structure of claim 1, wherein the conductive area has a shape substantially corresponding to a cross-section of the via-hole.

12. The micro LED mounting structure of claim 1, wherein the first layer includes at least one of a printed circuit board, a wafer, and glass, and
wherein the second layer comprises a film attached to the surface of the first layer.

13. A micro LED mounting structure comprising:
a micro LED including an electrode;
a base having a conductive pad disposed on a first surface of the base;
a film including a first surface on which the micro LED is disposed and a second surface disposed on the first surface of the base; and
a via including a via-hole and a conductive filler, the via-hole being provided through the film and having a first opening in the first surface of the film and a second opening in the second surface of the film, and the conductive filler being provided in the via-hole and including at least two conductive materials,
wherein the conductive filler includes a first end surface and a second end surface that are provided at opposite ends of the conductive filler, the first end surface contacting the electrode through the first opening and the second end surface contacting the conductive pad through the second opening,
wherein the first end surface is in substantially the same plane with an area within a specified area of the first opening in the first surface of the film,
wherein the second end surface is in substantially the same plane with an area within a specified area of the second opening in the second surface of the film,
wherein the conductive filler includes a first portion adjacent to the first end surface, a second portion adjacent to the second end surface, and a third portion between the first portion and the second portion,
wherein the at least two conductive materials include a metal material and a solder material different from the metal material, and
wherein the conductive filler is formed so that the first portion, the second portion and the third portion includes a mixture including the solder material and the metal material, and a first ratio of the solder material to the metal material in the third portion is less than a second ratio of the solder material to the metal material in the first portion and/or the second portion, and
wherein one or more portions of the conductive material between the third portion and the first portion and/or between the third portion and the second portion have a ratio of the solder material to the metal material that is between the first ratio and the second ratio.

14. The micro LED mounting structure of claim 13, wherein the ratio of the solder material to the metal material in the conductive filler increases from the third portion to the first portion and/or the second portion.

15. The micro LED mounting structure of claim 13, wherein an extension length of the conductive filler substantially corresponds to a thickness of the film.

16. The micro LED mounting structure of claim 13, wherein the electrode included in the micro LED includes a first electrode and a second electrode,
wherein the conductive pad formed on the base includes a first conductive pad connected with the first electrode and a second conductive pad connected with the second electrode, and
wherein the via includes a first via configured to connect the first electrode and the first conductive pad and a second via configured to connect the second electrode and the second conductive pad.

17. The micro LED mounting structure of claim 16, wherein the base includes a ground area, and
wherein one of the first conductive pad and the second conductive pad is electrically connected with the ground area.

18. The micro LED mounting structure of claim 13, wherein the via includes a plurality of sub-vias configured to electrically connect the electrode and the conductive pad.

* * * * *